(12) United States Patent
Fischer

(10) Patent No.: US 6,297,077 B1
(45) Date of Patent: Oct. 2, 2001

(54) PROCESS FOR MANUFACTURING CHIP CARDS, DEVICE FOR THE IMPLEMENTATION OF THIS PROCESS AND CHIP CARD

(75) Inventor: Dirk Fischer, Paderborn (DE)

(73) Assignee: Orga Kartensysteme GmbH, Paderborn (DE)

( * ) Notice: Subject to any disclaimer, the term of this patent is extended or adjusted under 35 U.S.C. 154(b) by 0 days.

(21) Appl. No.: 09/135,403

(22) Filed: Aug. 18, 1998

(30) Foreign Application Priority Data

Aug. 20, 1997 (DE) .............................. 197 36 082

(51) Int. Cl.[7] .................. H01L 21/44; H01L 21/48; H01L 21/50
(52) U.S. Cl. .................. 438/121; 438/106; 438/116; 257/679
(58) Field of Search .................. 438/106, 121, 438/116; 257/679

(56) References Cited

U.S. PATENT DOCUMENTS

| | | | |
|---|---|---|---|
| 5,567,362 | * | 10/1996 | Grun . |
| 5,681,356 | | 10/1997 | Barak et al. .................. 29/25.01 |

FOREIGN PATENT DOCUMENTS

| | | |
|---|---|---|
| 41 32 720 | 4/1993 | (DE) . |
| 41 42 392 | 7/1993 | (DE) . |
| 41 42 410 | 7/1993 | (DE) . |
| 295 04 946 | 9/1995 | (DE) . |
| 295 03 249 | 12/1995 | (DE) . |
| 44 19 973 | 12/1995 | (DE) . |
| 0 328 124 | 8/1989 | (EP) . |
| 0 430 282 | 6/1991 | (EP) . |
| 0 495 216 | 7/1992 | (EP) . |
| 0 521 778 | 1/1993 | (EP) . |
| 0 702 325 | 3/1996 | (EP) . |
| 0 742 533 | 11/1996 | (EP) . |
| 2 614 574 | 11/1988 | (FR) . |
| 9220506 | 11/1992 | (WO) . |
| 96/36009 | 11/1996 | (WO) . |
| 97/31334 | 8/1997 | (WO) . |

OTHER PUBLICATIONS

Patent Abstracts of Japan, vol. 5 No. 13, (M–86), Sep. 3, 1981, abstract of Shinichirou Takahashi, "Manufacture of Composite Product", Japanese 56–72939, Jun. 17, 1981.

Two Thousand and One Technology, Inc., Taipei, Taiwan, R.O.C., pp. 1–5, 2 sheets of drawings.

\* cited by examiner

*Primary Examiner*—Kevin M. Picardat
*Assistant Examiner*—Deven M. Collins
(74) *Attorney, Agent, or Firm*—Foley & Lardner

(57) ABSTRACT

The invention comprises a chip card, a process for making the chip card, and an injection molding device for the implementation of the process, wherein a mold in the injection molding device includes a minimum of one mold space and mold parts which are movable in relation to each other, whereby: a first injection nozzle is provided for injecting a first plastic material into a first mold compartment in the mold space; a second injection nozzle is provided for injecting a second plastic material into a second mold compartment in the mold space, and; in a preferred embodiment, the first injection nozzle is positioned vertically to the second injection nozzle.

22 Claims, 6 Drawing Sheets

PROCESS FOR MANUFACTURING CHIP CARDS, DEVICE FOR THE IMPLEMENTATION OF THIS PROCESS AND CHIP CARD

FIELD OF THE INVENTION

The invention relates to a process for manufacturing chip cards.

BACKGROUND OF THE INVENTION

A process and device for the manufacture of chip cards is disclosed in WO 92/20506 A1, according to which a chip card is manufactured of one single plastic material. A form tool is used to embrace a form tool component, which is movable in a transverse direction of the mold space in such a manner that the mold space can be reduced to imbed a chip module into the card body after the plastic material is injected into the mold space. By means of a punching tool which is movable in a transverse direction, a mini chip card imbedded in the card body is produced, forming a punching gap at the same time. The disadvantage of this known process is that the material characteristics of the plastic material are decisive for the strain on the card body on the one hand and the mini chip on the other hand.

SUMMARY OF THE INVENTION

Briefly, the present invention comprises, in one embodiment, a process to manufacture a chip card by injecting a molten plastic material into a mold and subsequently cooling down the plastic material, comprising the steps of: injecting a first plastic material into a first mold compartment while a second mold compartment is closed off with a slide gate; moving the slide gate that closes off the second mold compartment from the first mold compartment out of the mold space; and injecting a second plastic material into the second mold compartment.

In a further aspect of the present invention, the injecting steps comprise the first plastic material and the second plastic material being injected at right angles towards each other into the corresponding first mold compartment and the second mold compartment, respectively.

In a yet further aspect of the present invention, the second plastic material injecting step comprises injecting the second plastic material into the second mold compartment after the first plastic material injected into the first mold compartment has shrunk.

In a further aspect of the present invention, the second plastic material is shrunk after injection, with its border surfaces contacting a first body formed by the first plastic material in such a manner, that the first body is held positively interlocked by the second plastic material forming a second body.

In a yet further aspect of the present invention, the moving step comprises simultaneously with an outward movement of the slide gate, moving at least one additional tool part towards the mold space.

In a further aspect of the present invention, the second plastic material injecting step comprises the step of injecting the second plastic material in correspondence with the direction of movement of the slide gate relative to the second mold compartment.

In yet a further aspect of the present invention, the slide gate moving step comprises bringing the slide gate into a first position, in which it closes the first mold compartment off against the second mold compartment completely, and is then moved into a second position, in which the slide gate which further comprises a cavity shaper creates a recess in a mini chip carrier to be formed in said second mold compartment during the second plastic material injection step.

In a further embodiment of the present invention, a device is provided to implement a process for manufacturing a chip card by injecting a molten plastic material into a mold and subsequently cooling down the plastic material, with the mold including at least one mold space and including form parts, which are movable in relation to each other and which comprise: a first injection nozzle for injecting the first plastic material into a first mold compartment in the mold space while a second mold compartment in the mold space is closed off with a slide gate; and a second injection nozzle for injecting a second plastic material into the second mold compartment after moving the slide gate out of the mold space wherein the first injection nozzle is positioned at a right angle relative to the second injection nozzle.

In yet a further implementation of the invention, a chip card is provided comprising: a mini chip card; and a surrounding card body, wherein the mini chip card is produced from a first plastic material and the card body is produced from a second different plastic material.

In a further aspect of the present invention, the plastic materials have such chemical characteristics, that the first and the second plastic materials are not combinable with each other within a temperature range including the operating temperature of the injection process to form a non-adhesive plastic-plastic-combination.

In a further aspect of the present invention, the first plastic material comprise one from the group of Polyamide (PA) and Polyacetal (POM), and the second plastic material comprises the other from the group of PA and POM.

In a yet further aspect of the present invention, the first plastic material comprises one from the group of Polyamide (PA) and Polyacetal (POM), and the second plastic material comprises the other from the group of PA and POM.

BRIEF DESCRIPTION OF THE DRAWINGS

In the following sections, several examples for implementation of the invention will be explained in more detail with the aid of drawings.

The following is shown.

DETAILED DESCRIPTION OF THE PREFERRED EMBODIMENT

Figure 1:
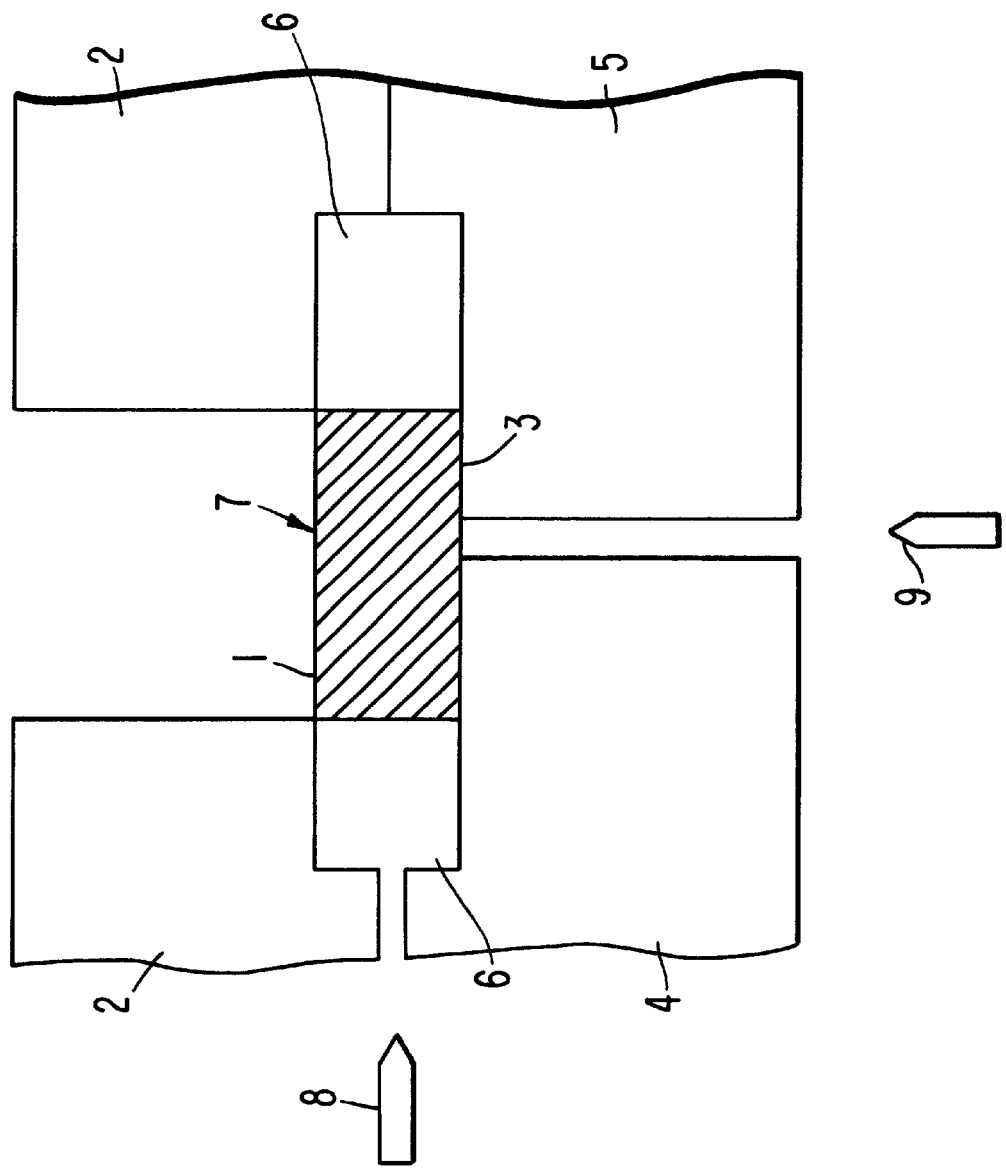
FIG. 1 is a schematic, partial section for a device for manufacturing chip cards including mini chip cards, with a slide gate in the initial form of implementation.

The purpose of the invention is to provide a process for manufacturing cards and a device for the implementation of this process in such a manner that a mini chip card and a card body surrounding such chip have material characteristics, which are adapted to a customer's requirements.

According to one embodiment of the invention, the chip card is manufactured by injecting plastic material number one into a first mold compartment, and by subsequently injecting plastic material number two into a second mold compartment, after a slide gate embracing the second mold compartment is moved outwards, so that the second plastic material attaches itself to the first plastic material along the border surface or fits tightly to such surface. The advantage of the process is that a chip card can be created in this manner, the mini chip carrier of which comprises a material which differs from the card body surrounding such carrier. The card body may, for example, comprise a recycled material, and the mini chip carrier may comprise a high-quality PC. Alternatively, different colorants may be added, so that the card body has a different color than the mini chip carrier.

In an advanced development of the invention, the injection nozzles are arranged vertically to each other. A slide gate situated inside the mold space separates the first from the second mold compartment. This allows positive injection of the plastic materials into one pre-set area of the mold space at each step.

In a further advanced development of the invention, the slide gate is moved in a transverse direction to the longitudinal level of the mold space, so that the second plastic material can subsequently be injected into the entirely cleared second mold compartment. Preferably, the slide gate is moved out on a side of the mold space, which is averted from the second nozzle.

In a preferred form of implementation of the invention, the border surfaces of the mini chip carrier on the one side and the border surfaces on the card body on the other side are loosely attached to each other, so that a narrow gap is formed. Preferably, this is made possible, not by subsequent punching of such gap, but by making use of the shrinkage of the plastic material. The basic concept underlying this is that the second plastic material is injected only after the first plastic material has already shrunk. Due to the subsequent shrinkage of the second plastic material forming the card body surrounding the mini chip carrier, the border surfaces of the card body press against the border surfaces of the mini chip carrier, thus warranting a squeeze clamping of the mini chip carrier within a recess in the card body.

Preferably, the plastic materials comprise materials which are not chemically combinable with each other. PS and PC are a possible material combination.

In an advanced development of the invention, one side of the slide gate is equipped with a cavity shaper, the contour of which corresponds to a cavity, which is to be molded into the mini chip carrier. The slide gate is moved out of the mold compartment only so far, until the cavity shaper fills the desired cavity in the second mold compartment. After the second plastic material has cooled down, the slide gate is completely removed from the mold space, and thus the pre-set cavity is shaped. The advantage being, that the slide gate has two functions. Firstly, it separates the first mold compartment from the second compartment. Secondly, the special design of its contour allows the creation of a cavity.

In an advanced development of the invention, the slide gate is designed as a hollow shape. The advantage being, that this allows insertion of a die, which, with its fore-part, presses the chip module into the second mold compartment. The die with the chip module is moved coaxially with the slide gate through an opening in the slide, after the slide gate has been removed from the second mold compartment. Alternatively, the slide gate can also be moved in the direction of the second nozzle.

In an advanced development of the invention, the slide gate is designed as a hollow shape and is characterized by at least one trough at a side away from the direction of its outward movement. In an initial position of the slide gate, the first mold compartment is completely separated from the second compartment, so that the first plastic material can be injected into the first mold compartment, without the plastic material being able to penetrate into the second mold compartment. In a second position, the slide gate is moved outward over such a distance, that the trough or notch permits a connection between the first and the second mold compartments. After injection of the second plastic material, a connecting snug is created at this spot, which will be cut before the mini chip card is put into use.

The invention is further based on the task of creating a chip card with variable material characteristics.

A main advantage of the chip card as described in the invention is to be seen in the fact that the mini chip card can be made of a different material with different material characteristics than the card body. The mini chip card may, for example, comprise a very firm material and the card body may comprise a tough or flexible material. Alternatively, the card body may comprise a favorably priced recycled material.

In a preferred form of implementation, the chip card consists of materials, which cannot be chemically combined, so that a mini chip card, which is positively locked in a recess within the card body can be produced by easy means, avoiding the need of a subsequent step to punch a gap.

FIG. 1 shows a device for the manufacture of chip cards, with a slide gate 1 according to a first implementation example. Slide gate 1 runs on bearings in an upper half 2 of a mold. Slide gate 1 can be constructed as a movable die with a plane fore-part 3.

In its starting position, slide gate 1 fits smoothly against a surface composed by two lower mold compartments 4 and 5. The mold space comprises a first mold compartment 6 and a mold compartment 7, which is filled out by slide gate 1 and which is completely embraced by the first mold compartment 6. In a first step, a first plastic material is injected through a first nozzle 8 into the first mold compartment 6 with the slide gate 1 present. The material can, for example, be polyvinyl chloride (PVC), polypropylene (PP), acrylonitrite-butadiene-styrol-copolymeri sate (ABS) or a recycled material consisting of these substances.

Figure 5:
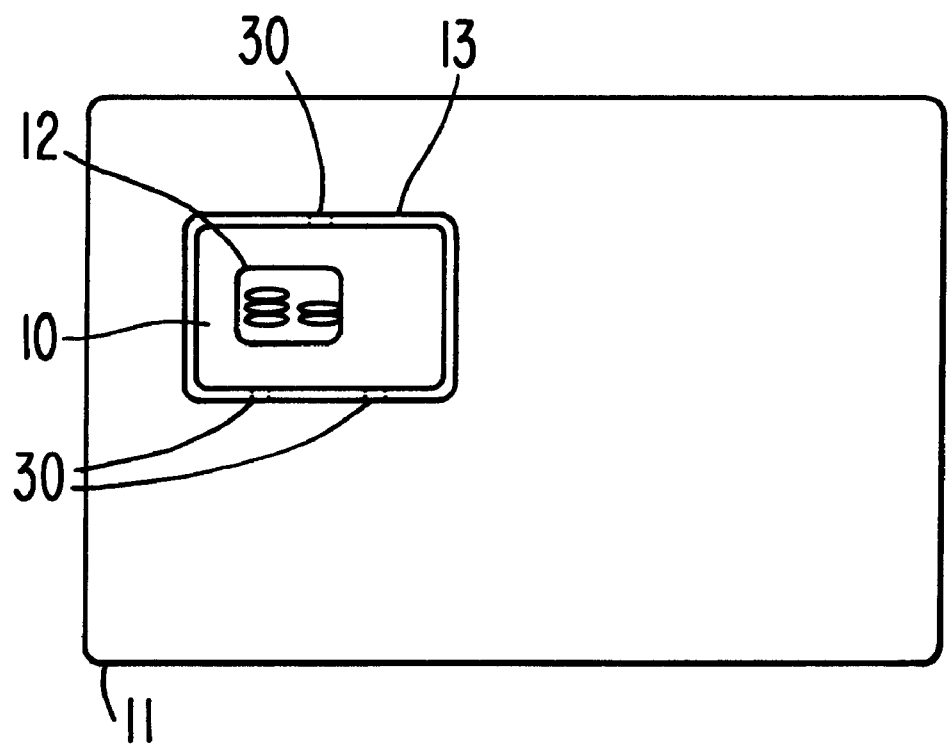
FIG. 5 is a top view of a chip card with imbedded mini chip card.

In a second step, slide gate 1 is removed from the mold compartment, opening the second mold compartment 7, so that a second plastic material can be injected into the second mold compartment 7 through a second nozzle 9, which is positioned vertically to the first nozzle 8. The second plastic material may comprise PC, ABS, PP, PVC or a recycled material, and may possibly contain certain color pigments, thus generating a different coloration of a mini chip carrier 10, which is generated in mold compartment 7 in this manner and which is shown in FIG. 5. Alternatively, the second plastic material may be chosen to provide mini chip carrier 10 with better flectional strength, dimensional stability or temperature resistance than a surrounding card body 11 comprising the first plastic material. Card body 11 may, for example, comprise a particularly elastic first plastic material.

After bonding and/or chemical binding along the border faces of the first and second plastic materials, which are present as molten masses, a cavity to take up a chip module 12 is sunk into mini chip carrier 11 in a further processing step, and at least one gap 13 is generated through punching.

Figure 2:
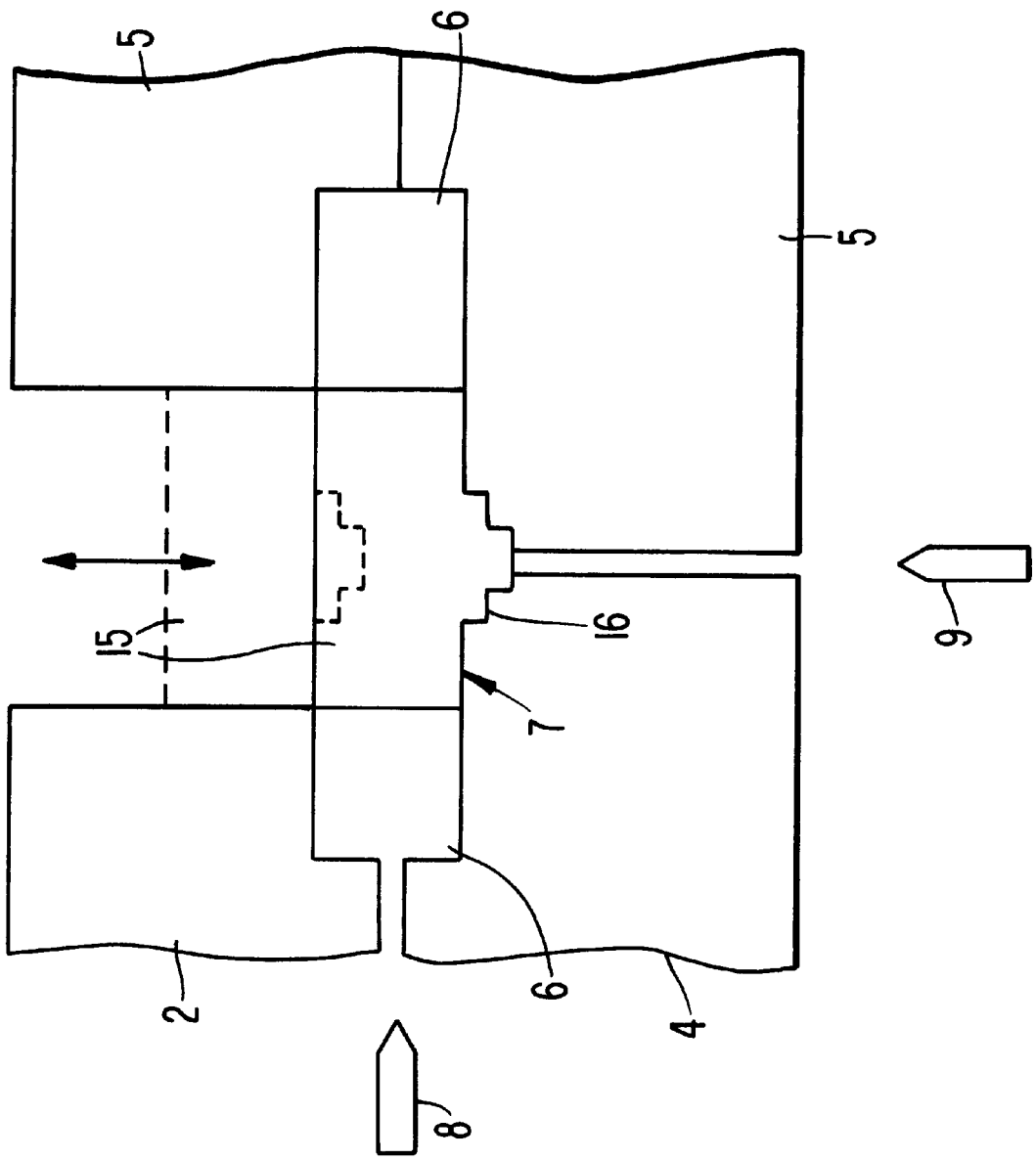
FIG. 2 is a schematic, partial section for a device for manufacturing chip cards including mini chip cards, with a slide gate in the second form of implementation.

According to a second implementation example shown in FIG. 2, the device is equipped with a slide gate 15, the lower side of which is stepped in conformity with the cavity, constituting cavity shaper 16. The other components of this implementation example correspond to the components shown in the first implementation example and bear the same reference numbers.

In correspondence with the manufacturing process described under the first implementation example, the first plastic material is injected into the first mold compartment 6. After that, slide gate 15 is moved out of the second mold compartment only that far, that cavity shaper 16 of the slide gate 15 is still situated within mold compartment 7, i.e., the protruding cavity shaper 16 is in its entirety positioned inside mold compartment 7 as shown in dash line outline. Only after injection of the second plastic material by means of nozzle 9, is cavity shaper 16 removed from the mold space, so that a cavity is formed within the chip card. After that, only a punching step is required to generate gap 13.

Figure 3:
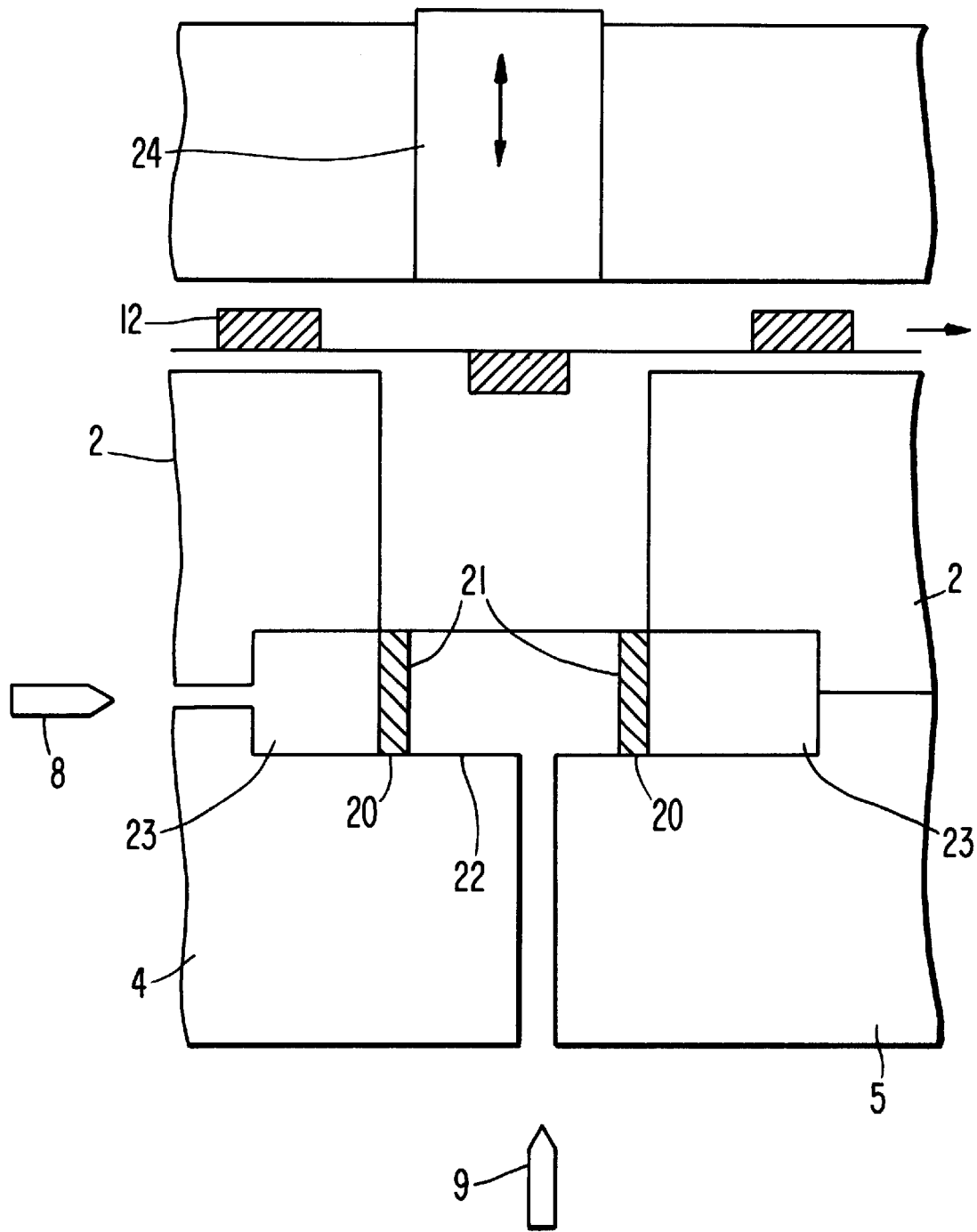
FIG. 3 is a schematic, partial section for a device for manufacturing chip cards including mini chip cards, with a slide gate in the third form of implementation.

In another implementation example shown in FIG. 3, a slide gate is constructed as a hollow body and/or frame, with frame sides 21 separating an inner mold compartment comprising a second mold compartment 22 from an outer, first mold compartment 23. The opening in slide gate 20 allows a die 24 to be moved in a different direction to the movement of the slide gate into a section of the second mold compartment 22. Die 24 takes up a chip module 12 being conveyed on an endless conveyor running in a perpendicular direction to the direction of movement of die 24, and, with its fore-part, the die forces this chip in the direction of the mold space. Die 24 comes to a stop, as soon as the lower edge of chip module 12 is flush with the upper edge of the second mold compartment 22. Only now, is the second plastic material injected into the second mold compartment 22 and then die 24 is lowered further, so that the upper side of chip module 12 is flush with the upper side of the second mold compartment 22, or mini chip carrier 10. After a sufficient cooling time has passed, the mold is opened, with chip module 12 being firmly integrated into the chip card. In a subsequent step, gap 13 is in the known manner punched along the borders of the mold sections.

If slide gate 21 is not moved upwards simultaneously with the downward movement of die 24, this may be removed after the second plastic material is injected, so that the subsequent punching process to generate gap 13 may be dispensed with. This variation may preferably be applied, when the two plastic materials have different shrinkage characteristics, so that the mini chip card is squeeze-clamped in the card body 11. The utilization of shrinkage behavior will be explained later in this description.

Figure 4:
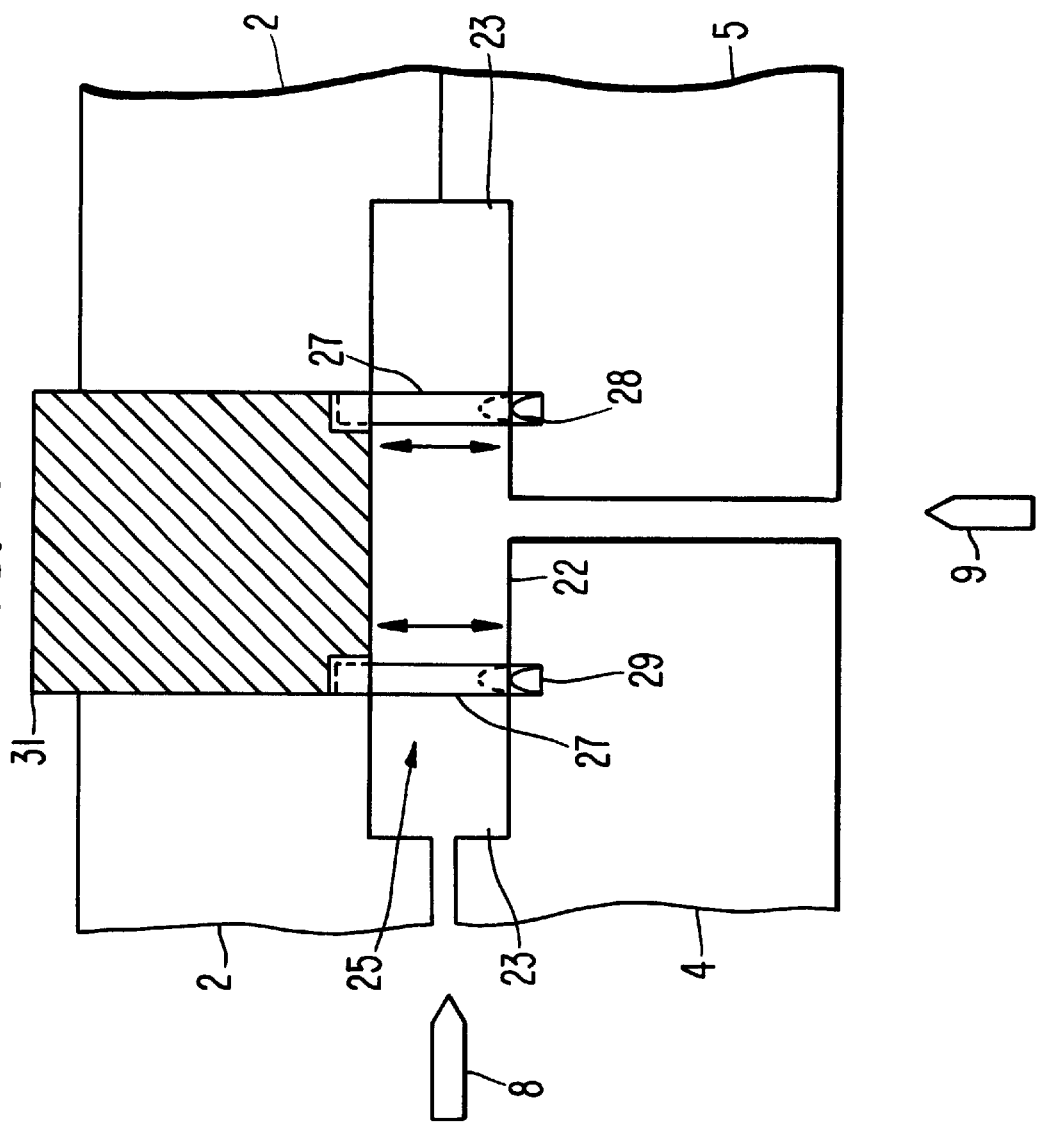
FIG. 4 is a schematic, partial section for a device for manufacturing chip cards including mini chip cards, with a slide gate in the fourth form of implementation.

According to another implementation example shown in FIG. 4, a slide gate 25 is constructed as a hollow body with frame sides 27 and, in modification of the previous implementation example, it is additionally equipped with notches 28 in certain areas of the bottom sides of the frame sides 27. In an initial position of slide gate 25 shown in solid lines, the notches 28 are positioned below mold compartment 22 in a channel 29 of mold compartments 4 and 5, so that the first plastic material can be injected into the first mold compartment 23, with the second, inner mold compartment 22 being completely closed off by slide gate 25. In a subsequent, second position of slide gate 25 shown in dashed lines, the bottom side of this gate 25 is substantially flush with the bottom sides of mold compartment 22, with the notches 28 each creating a connecting seam 30 (see FIG. 5) between the first and the second mold compartments 23 and 22. Following injection of the second plastic material into the second mold compartment 22 via nozzle 9, this material spreads into the areas of notch 28 in the second mold compartment 22, whilst forming a bond. After that, slide gate 25 is removed from the mold space. In this manner, the frame sides 27 of slide gate 25 create gap 13 between card body 11 and mini chip carrier 10. Through the opening in slide gate 25, a die 31 may—as in the previous implementation example—engage to insert chip module 12, so that after removal of slide gate 25 and cooling down of the plastic material, die 31 can eject the finished chip card.

Figure 6:
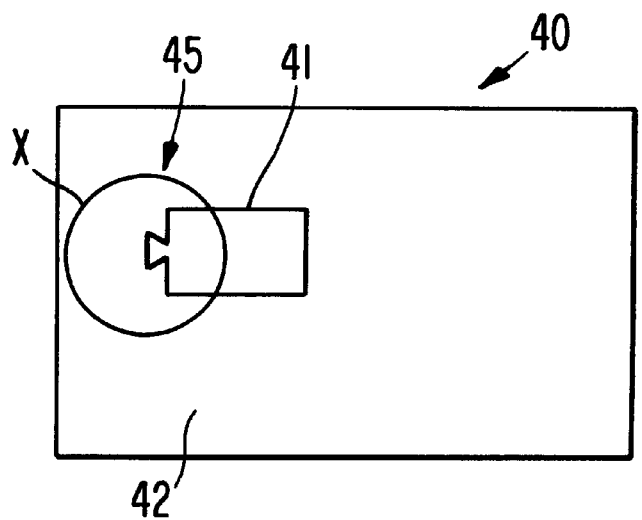
FIG. 6 is a top view of a chip card in another form of implementation.
Figure 7:
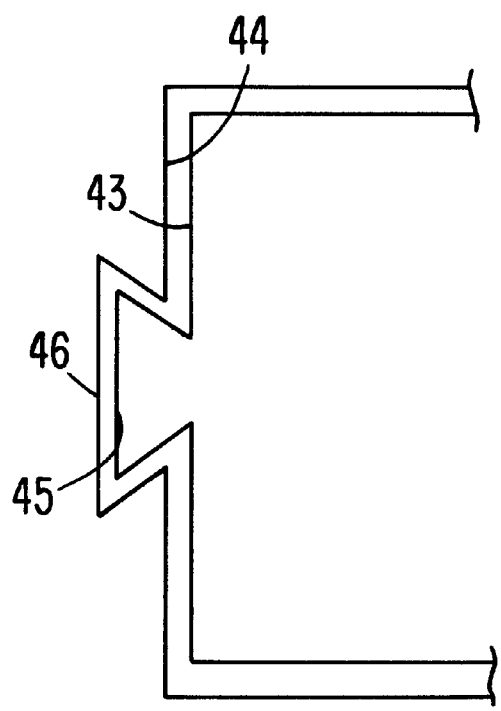
FIG. 7 is an enlargement of detail X of FIG. 6.

According to an implementation example shown in FIG. 6 and FIG. 7, a chip card 40 comprises of a mini chip card 41 of a first plastic material and a card body 42 of a second plastic material. The two plastic materials are selected in such a manner that they cannot be chemically combined. This has the effect that in case of raised temperatures, i.e., operating temperatures during the injection molding process of card 40, no chemical bonding forces are acting, so that after cooling down, the mini chip card 41 with its border surface 43 is in loose contact with a corresponding border surface 44 of card body 42. Preferably, manufacture of card 40 is performed in such a manner, that a die fills the mold compartment provided for card body 42, with the first plastic material being injected into another mold compartment, to produce mini chip card 41. After removal of the die, and when the first plastic material of the mini chip card 41 has cooled down whilst shrinking, the second plastic material is injected into the mold compartment provided for card body 42. Due to the subsequent shrinkage of the second plastic material, border surface 44 of card body 42 presses against border surface 43 of mini chip card 41, so that this is held positively interlocked. Punching of a gap to separate mini chip card 31 and card body 42 is not required.

Alternatively, materials exhibiting different shrinkage behavior may be chosen, particularly with the plastic material provided for card body 42 exhibiting a higher tendency towards shrinking than the plastic material provided for mini chip card 41. This allows acceleration of the manufacturing process.

FIG. 7 shows particularly clearly, that the mini chip card 41 is at one short side provided with a dovetailed projection 45, which engages into receptacle 46 of card body 42. With regard to production engineering, this is realized by means of a die with appropriate contours. The shape of projection 45 creates improved squeeze clamping of mini chip card 41 within the recess of card body 42.

By way of example, the plastic material PA on the one hand and POM on the other hand are to be mentioned as first and second, chemically noncombinable, plastic materials that may be used to implement the invention. Furthermore, there is PS on the one hand and PBT or PC or PMMA on the other hand as first and second plastic materials to implement the present invention.

Alternatively, the second plastic material may be injected into the second mold compartment first and then the first plastic material into the first mold compartment. Decisive is that when a chip card as shown in FIG. 5 is created, the mini chip carrier 10 comprises a different plastic material than the card body 11, which surrounds it.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A process to manufacture a chip card by injecting a molten plastic material into a mold and subsequently cooling down the plastic material, comprising the steps of:
   injecting a first plastic material into a first mold compartment while a second mold compartment is closed off with a slide gate;
   moving the slide gate that closes off the second mold compartment from the first mold compartment out of the mold space; and
   while maintaining the mold and the injected first plastic material stationary, injecting a second plastic material into the second mold compartment.

2. A process according to claim 1, wherein said injecting steps comprise the first plastic material and the second plastic material being injected at right angles towards each other into the corresponding first mold compartment and the second mold compartment, respectively.

3. A process according to claim 1, wherein the second plastic material injecting step comprises injecting the second plastic material into the second mold compartment after the first plastic material injected into the first mold compartment has shrunk.

4. A process according to claim 2, wherein the second plastic material injecting step comprises injecting the second plastic material into the second mold compartment after the first plastic material injected into the first mold compartment has shrunk.

5. A process according to claim 1, wherein the second plastic material is shrunk after injection, with its border surfaces contacting a first body formed by the first plastic material in such a manner, that the first body is held positively interlocked by the second plastic material forming a second body.

6. A process according to claim 2, wherein the second plastic material is shrunk after injection, with its border surfaces contacting a first body formed by the first plastic material in such a manner, that the first body is held positively interlocked by the second plastic material forming a second body.

7. A process according to claim 3, wherein the second plastic material is shrunk after injection, with its border surfaces contacting a first body formed by the first plastic material in such a manner, that the first body is held positively interlocked by the second plastic material forming a second body.

8. A process according to claim 1, wherein said moving step comprises simultaneously with an outward movement of the slide gate, moving at least one additional tool part towards the mold space.

9. A process according to claim 2, wherein said moving step comprises simultaneously with an outward movement of the slide gate, moving at least one additional tool part towards the mold space.

10. A process according to claim 3, wherein said moving step comprises simultaneously with an outward movement of the slide gate, moving at least one additional tool part towards the mold space.

11. A process according to claim 5, wherein said moving step comprises simultaneously with an outward movement of the slide gate, moving at least one additional tool part towards the mold space.

12. A process according to claim 1, wherein said second plastic material injecting step comprises the step of injecting the second plastic material in correspondence with the direction of movement of the slide gate relative to the second mold compartment.

13. A process according to claim 2, wherein said second plastic material injecting step comprises the step of injecting the second plastic material in correspondence with the direction of movement of the slide gate relative to the second mold compartment.

14. A process according to claim 3, wherein said second plastic material injecting step comprises the step of injecting the second plastic material in correspondence with the direction of movement of the slide gate relative to the second mold compartment.

15. A process according to claim 5, wherein said second plastic material injecting step comprises the step of injecting the second plastic material in correspondence with the direction of movement of the slide gate relative to the second mold compartment.

16. A process according to claim 8, wherein said second plastic material injecting step comprises the step of injecting the second plastic material in correspondence with the direction of movement of the slide gate relative to the second mold compartment.

17. A process according to claim 1, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

18. A process according to claim 2, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

19. A process according to claim 3, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

20. A process according to claim 5, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

21. A process according to claim 8, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

22. A process according to claim 12, wherein the slide gate moving step comprises bringing the slide gate into a first position, in which it closes the first mold compartment off against the second mold compartment completely, and is then moved into a second position, in which the slide gate, which further comprises a cavity shaper, creates a recess in a mini chip carrier to be formed in said second mold compartment during said second plastic material injection step.

* * * * *